US006163465A

United States Patent [19]

Tanner et al.

[11] Patent Number: 6,163,465

[45] Date of Patent: Dec. 19, 2000

[54] CABLE STORAGE COMPARTMENT FOR NETWORK COMPUTER

[75] Inventors: Howard Carl Tanner, Round Rock; Brian Michael Kerrigan, Austin; Stephen Sung, Austin; Michael Edward Criscolo, Austin, all of Tex.

[73] Assignee: International Business Machines Corporation, Armonk, N.Y.

[21] Appl. No.: 09/174,879

[22] Filed: Oct. 19, 1998

[51] Int. Cl.$^{7}$ .............................. H02B 1/20; H05K 7/00; H01R 13/72

[52] U.S. Cl. .......................... 361/827; 361/683; 361/826; 439/501; 206/702

[58] Field of Search .................................... 361/685, 826, 361/827, 683; 174/135; 206/320, 702; 439/501

[56] References Cited

U.S. PATENT DOCUMENTS

| | | | |
|---|---|---|---|
| 3,725,848 | 4/1973 | Davidson | 174/135 |
| 3,949,487 | 4/1976 | Bartram et al. | 174/135 |
| 4,517,757 | 5/1985 | Asada et al. | 174/135 |
| 5,457,600 | 10/1995 | Campbell et al. | 361/643 |
| 5,462,350 | 10/1995 | Brightman et al. | 312/351.7 |
| 5,469,844 | 11/1995 | Rogler | 206/320 |
| 5,748,442 | 5/1998 | Toor | 361/685 |

*Primary Examiner*—Jayprakash N. Gandhi
*Attorney, Agent, or Firm*—Casimer K. Salys; Felsman, Bradley, Vaden, Gunter & Dillon, LLP

[57] ABSTRACT

A computer tower has a variety of electronic components mounted within an enclosure. Power and communication-type cables extend from the enclosure for connection to a power source and peripheral components such as a monitor or operator interface. A pedestal is mounted to the lower end of the enclosure to increase the stability of the computer tower when it is placed on a level surface. The bottom of the pedestal has a recess or channel which extends all the way around the pedestal near its outer edge. The unused length of the cables may be coiled into the channel of the pedestal for temporary and aesthetically appealing storage.

13 Claims, 4 Drawing Sheets

CABLE STORAGE COMPARTMENT FOR NETWORK COMPUTER

CROSS-REFERENCES TO RELATED APPLICATIONS

This application is related to commonly invented and assigned co-pending U.S. patent application Ser. No. 09/177,873, filed Oct. 23, 1998, entitled Remote Operator Interface For A Network Computer and is incorporated herein by reference.

TECHNICAL FIELD

This invention relates in general to electronic computers and in particular to a cable storage compartment for a computer.

BACKGROUND ART

Electronic computers house a variety of electronic components such as printed circuit boards, connectors, a power supply and the like. Each of these components is mounted to a chassis which is located inside an external housing or enclosure. Enclosures for computer towers typically have a base which is flush mounted with a desk or floor support surface.

Power and communication-type cables extend from the enclosure for connection to a power source and peripheral components such as a monitor or operator interface. Since these cables are provided in lengths which are more than sufficient, some portion of the cables is usually left loosely coiled on the floor or otherwise unaccounted for. Excessive cable can create a safety hazard and is aesthetically unacceptable. Prior art tailstock of the enclosure. Although these designs are workable, an improved design for accommodating excessive cable is desirable.

DISCLOSURE OF THE INVENTION

A computer tower has a variety of electronic components mounted within an enclosure. Power and communication-type cables extend from the enclosure for connection to a power source and peripheral components such as a monitor or operator interface. A pedestal is mounted to the lower end of the enclosure to increase the stability of the computer tower when it is placed on a level surface. The bottom of the pedestal has a recess or channel which extends all the way around the pedestal near its outer edge. The unused length of the cables may be coiled into the channel of the pedestal for temporary and aesthetically appealing storage.

BEST MODE FOR CARRYING OUT THE INVENTION

Figure 1:
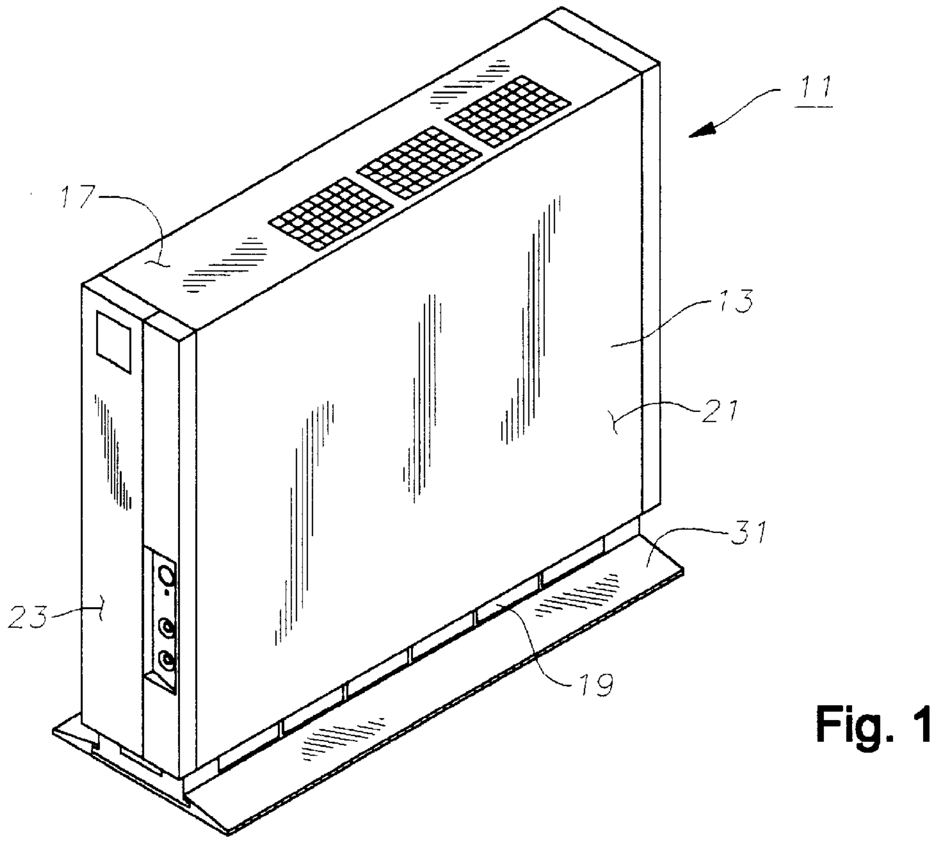
FIG. 1 is a front isometric view of a computer constructed in accordance with the invention.
Figure 2:
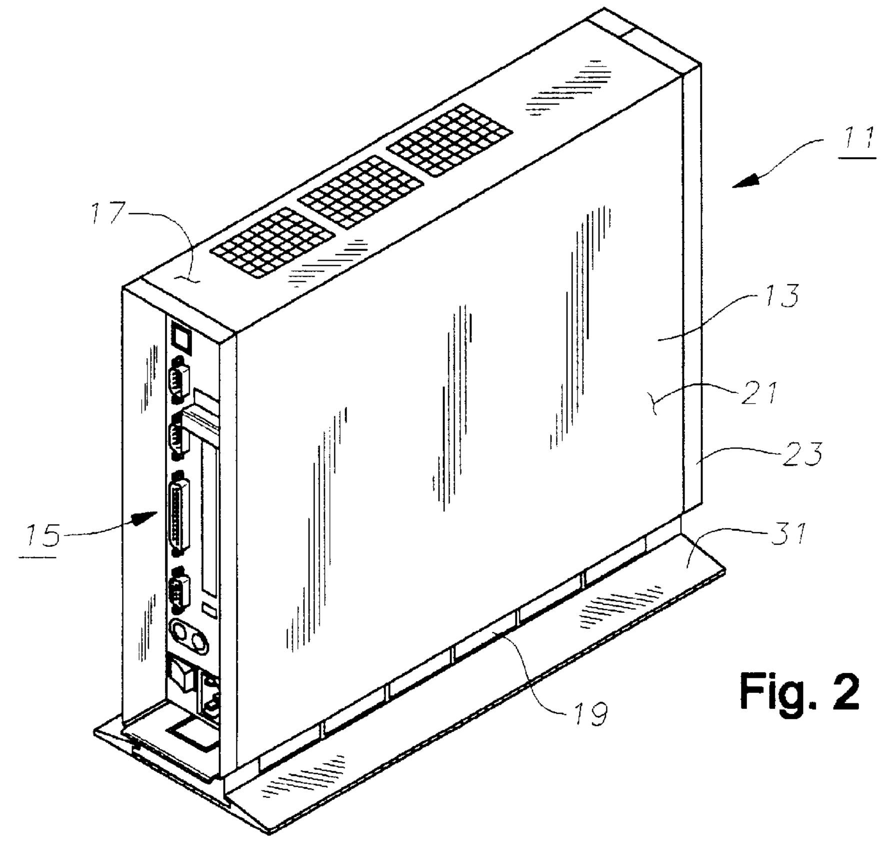
FIG. 2 is a rear isometric view of the computer of FIG. 1.

Referring to FIGS. 1 and 2, a network computer tower 11 is shown. In this disclosure, the term "tower" is used in reference to a computer which has a vertical dimension which is significantly greater than its horizontal width, such that the computer has a tall rectangular profile when viewed from either end. Computer 11 has an external metal housing or enclosure 13 and an internal metal frame or chassis 15. Enclosure 13 is essentially a five-sided rectangular box with an opening on a rearward end. Enclosure 13 has a top panel 17, a bottom panel 19, and two side panels 21, all of which are formed from a single sheet of metal which is bent to form four corners. The top panel 17 and the bottom panel 19 having widths which are less than a height of the side panels 21. A front panel 23 is integrally joined to the forward end of enclosure 13. A base 31 is mounted to the lower surface of bottom panel 19. Base 31 has a lower surface area which is larger than the area of bottom panel 19 but is significantly smaller than prior art designs.

Figure 3:
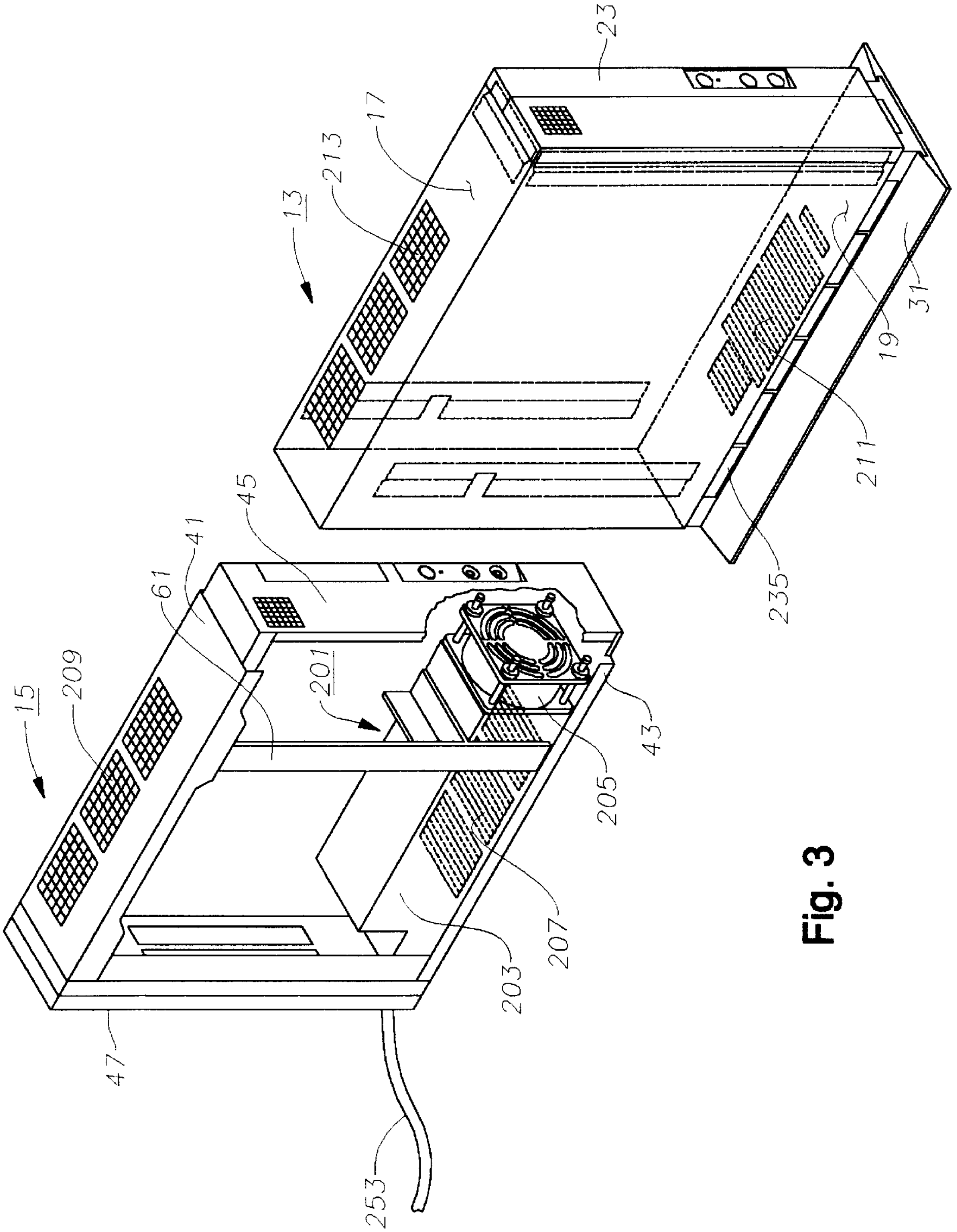
FIG. 3 is a front isometric, partially transparent view of the computer of FIG. 1 shown with its chassis removed from its enclosure and with its electronic components removed.

As shown in FIG. 3, chassis 15 is slidably mounted within enclosure 13. Chassis 15 has a rectangular perimeter of four wall-like frame members including a top 41, a bottom 43 and front and rear ends 45, 47. This configuration allows the vertical sides of chassis 15 to remain open and uncovered. A strut 61 is mounted to and extends vertically between top 41 and bottom 43.

Figure 4:
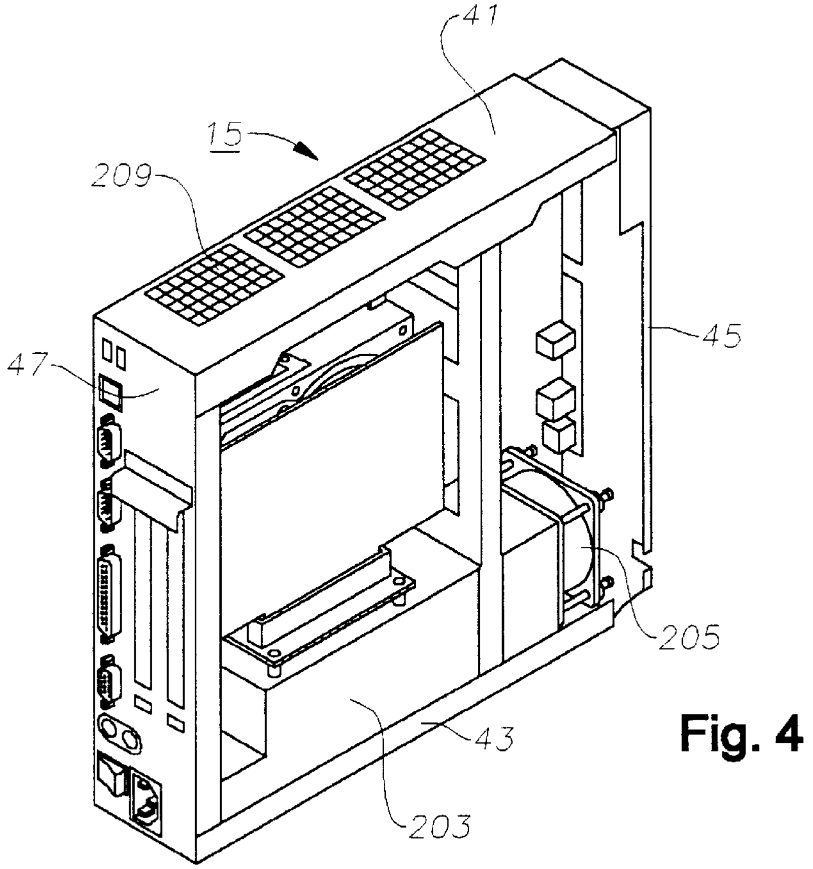
FIG. 4 is a rear isometric view of the chassis of FIG. 3 shown with its electronic components.

Referring now to FIGS. 3 and 4, chassis 15 also has a power supply 201 mounted to bottom 43. Power supply 201 has a square tubular sheet metal housing 203 with an opening on its forward end. A ventilation fan 205 is mounted to the opening and is located within a perimeter of chassis 15 and is spaced apart from a rearward side of front end 45 and the other sidewalls of chassis 15 and enclosure 13. Housing 203 is open on its lower side for communication with an air exhaust port 207 in bottom 43. An air intake port 209 is located at the upper end of chassis 15 in top 41. Ports 207, 209 have counterpart ports 211, 213, respectively, in enclosure 13. Ports 211, 213 are essentially a series of perforations in bottom panel 19 and top panel 17, respectively. When chassis 15 is mounted in enclosure 13 (FIG. 4), port 207 aligns with port 211 and port 209 aligns with port 213.

Figure 5:
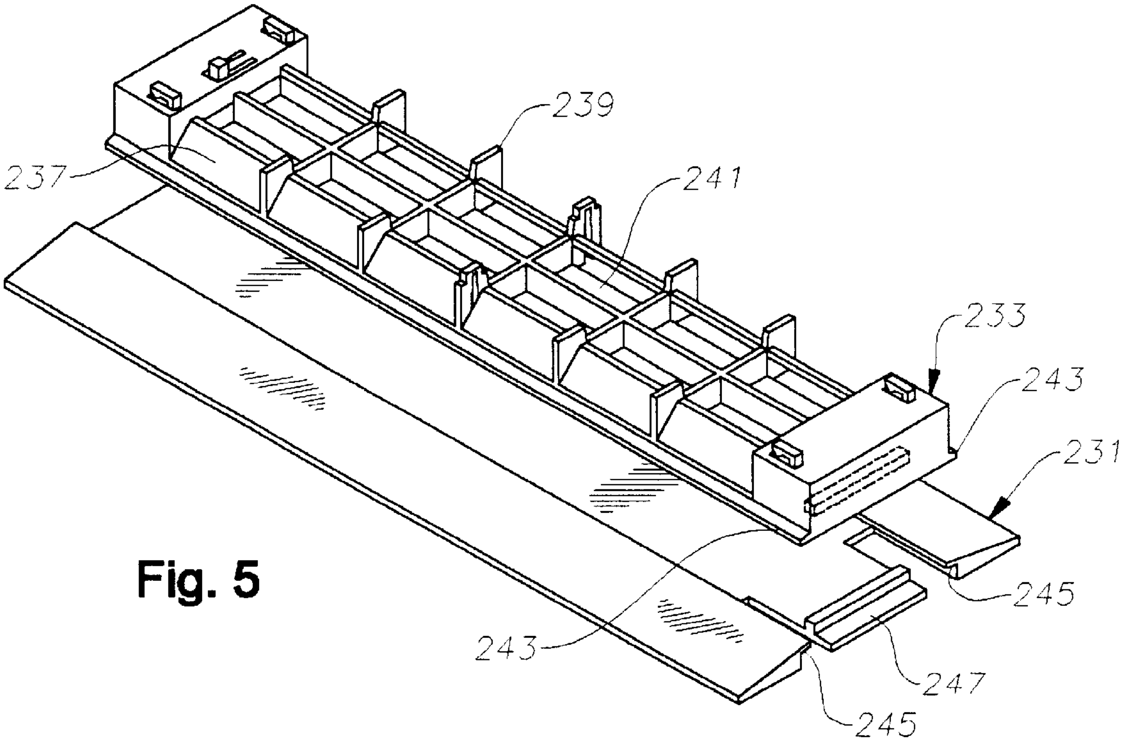
FIG. 5 is an isometric view of a diffuser of the computer of FIG. 1.

As shown in FIG. 5, base 31 comprises a pedestal 231 which defines the bottom of computer 11 and a diffuser 233. Diffuser 233 comprises a generally flat rectangular member with a plurality of slots 235 (FIG. 3) extending along and below side panels 21 from near the back to near the front. The slots 235 are formed by downward inclined walls 237 and vertical stand-offs or legs 239 to diffuse exhausting air laterally from enclosure 13. Legs 239 are spaced-apart from each other and mount to the lower surface of bottom panel 19. A slot 235 is defined between each adjacent pair of the legs 239. Legs 239 also create space between diffuser 233 and the lower surface of bottom panel 19. Diffuser 233 also has an upper surface with a trough 241 for containing any debris that might fall through exhaust port 211 in bottom panel 19 during a fire.

Pedestal 231 is detachably coupled to diffuser 233 for stabilizing computer 11. The elongated sides of diffuser 233 each have a flat flange 243 for slidably coupling to a groove 245 in pedestal 231. Each flange 243 has a taper on one end to create an interference fit between flanges 243 and the grooves 245 in pedestal 231 when it is installed on diffuser 233. Pedestal 231 also has a latch 247 for releasably connecting it to diffuser 231.

Figure 6:
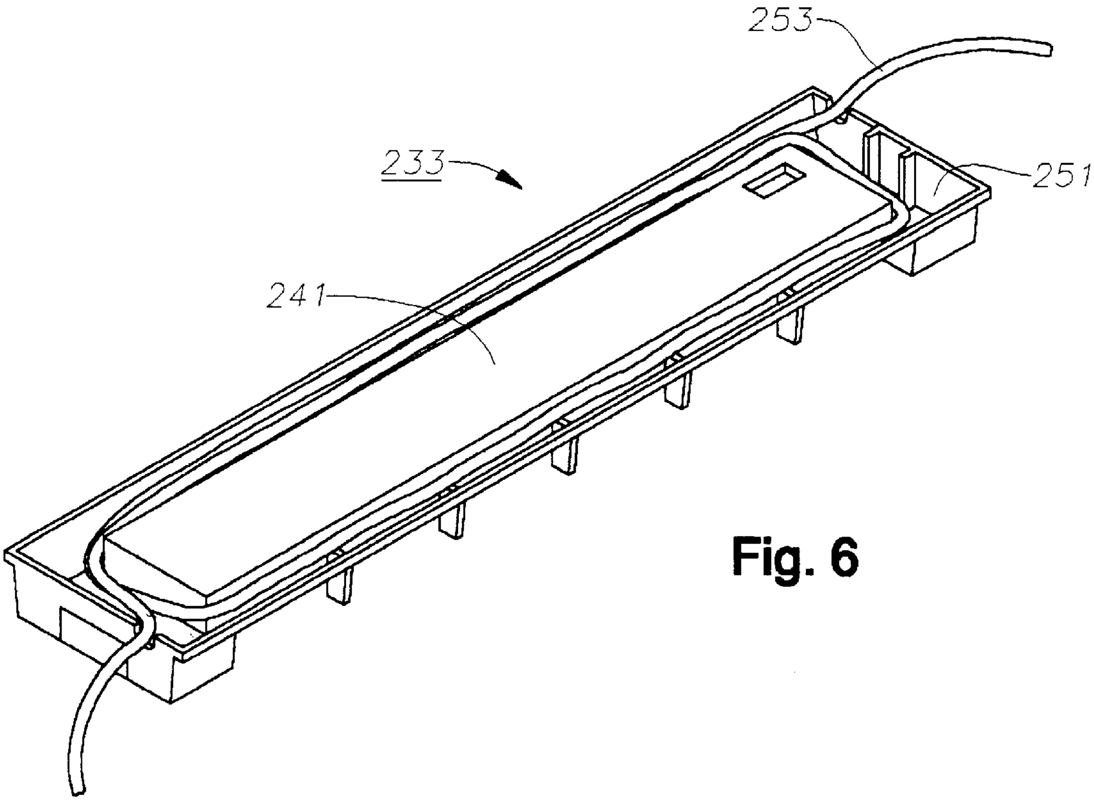
FIG. 6 is a lower isometric view of the diffuser of FIG. 5.

As shown in FIG. 6, the underside of diffuser 233 is provided with a channel or recess 251. Recess 251 extends around the periphery of diffuser 233 near its outer edge and circumscribes the bottom of trough 241. Recess 251 is located just below walls 237 and extends through the lower portions of legs 239. Recess 251 is provided for housing the unused length of a cable 253 (FIGS. 3 and 6) which extends from enclosure 13 near the lower surface of the computer 11 to a desired end location. Cable 253 is stored in recess 251 by coiling it around the lower portion of trough 241. Cable 253 may comprise one or more of a variety of cables such as an operator interface cable.

In operation, enclosure 13 closely receives chassis 15 such that top panel 17 and bottom panel 19 slidably abut top 41 and bottom 43. In addition, the vertical side edge portions of top 41 and bottom 43 slidably engage side panels 21 to eliminate excessive movement between chassis 15 and enclosure 13. After computer 11 is positioned in a permanent location, cable 253 is extended from computer 1I1 to a desired end destination, such as an operator interface at a keyboard (not shown). The excess length of cable 253 and/or other cables (not shown) which is not required to reach the end destination may be stored by coiling it in recess 251 on the underside of mounting portion 233. Pedestal 231 is then secured to mounting portion 233 so that recess 251 forms a closed compartment for retaining cable 253.

The invention has advantages. The channel located in the base allows excess cable length to be removably stored in the pedestal by coiling the cable out of sight. This design is a safe and aesthetically appealing way of accounting for excess cable length.

While the invention has been shown or described in only some of its forms, it should be apparent to those skilled in the art that it is not so limited, but is susceptible to various changes without departing from the scope of the invention. For example, the recess for cable storage may be located in the diffuser or in the pedestal, depending upon which configuration is selected by the end user.

What is claimed is:

1. A computer, comprising:

a computer tower enclosure containing a plurality of electronic components mounted thereto;

a base having a recess and located on a lower surface of the enclosure for supporting the enclosure on a mounting surface; and a cable which is in communication with the electronic components, wherein the cable has a proximal portion located adjacent to the enclosure, and a distal portion extending away from the enclosure, and wherein the proximal portion of the cable is located in the recess of the base such that the proximal portion is hidden from view.

2. The computer of claim 1 wherein the recess extends around a periphery of the base and wherein the proximal portion of the cable is coiled in the recess.

3. The computer of claim 1 wherein an end of the proximal portion of the cable is connected to an operator interface and an end of the proximal portion of the cable extends into the enclosure.

4. The computer of claim 1 wherein the base comprises a mounting portion which secures to the enclosure, and a pedestal which is wider than the mounting portion and attaches to the mounting portion, and wherein the recess is in the mounting portion.

5. The computer of claim 4 wherein the pedestal comprises a flat plate which closes the recess on a lower end of the mounting portion.

6. An electronic apparatus, comprising:

an enclosure containing a plurality of electronic components mounted thereto;

a mounting portion secured to a lower surface of the enclosure;

a pedestal attached to and wider than the mounting portion;

a recess in a lower surface of the mounting portion extending around a periphery of the mounting portion; and a cable which is in communication with the electronic components, wherein the cable has a proximal portion located adjacent to the enclosure, and a distal portion extending away from the enclosure and wherein the proximal portion of the cable is located in the recess such that the proximal portion is hidden from view.

7. The apparatus of claim 6 wherein an end of the distal portion of the cable is connected to an operator interface and an end of the proximal portion of the cable extends into the enclosure.

8. The apparatus of claim 6 wherein the pedestal comprises a flat plate which closes the recess on a lower end of the mounting portion.

9. The apparatus of claim 6 wherein the cable comprises a plurality of cables, each having a proximal portion located in the recess.

10. A method for storing a computer cable, comprising:

(a) providing a computer with a cable extending therefrom and a base for supporting the computer on a mounting surface, the base having a recess in its lower surface, and the cable having a proximal portion and a distal portion;

(b) extending the distal portion of the cable away from the computer; and (c) storing the proximal portion of the cable in the recess of the base such that the proximal portion is not visible from an exterior of the computer.

11. The method of claim 10 wherein step (c) comprises coiling the proximal portion of the cable into the recess around a periphery of the base.

12. The method of claim 10 wherein step (b) comprises connecting an end of the distal portion of the cable to an operator interface.

13. The method of claim 10 wherein step (a) comprises attaching a mounting portion of the base to the enclosure, wherein the recess is formed in the mounting portion; and further comprising the step of securing a pedestal to the mounting portion after step (c) to close the recess and retain the proximal portion of the cable therein.

* * * * *